United States Patent [19]
Baek

[11] Patent Number: 6,011,739
[45] Date of Patent: Jan. 4, 2000

[54] SEMICONDUCTOR MEMORY

[75] Inventor: Dae Bong Baek, Kyungki-do, Rep. of Korea

[73] Assignee: LG Semicon Co., Ltd., Cheongju-Si, Rep. of Korea

[21] Appl. No.: 09/071,893

[22] Filed: May 5, 1998

[30] Foreign Application Priority Data

Aug. 20, 1997 [KR] Rep. of Korea ............................. 39728

[51] Int. Cl.[7] ................................. G11C 7/02; G11C 7/00
[52] U.S. Cl. ........................... 365/210; 365/205; 365/207; 365/208
[58] Field of Search .................................. 365/210, 205, 365/207, 208, 203

[56] References Cited

U.S. PATENT DOCUMENTS

| | | | |
|---|---|---|---|
| 4,831,591 | 5/1989 | Imazeki et al. | 365/210 |
| 5,255,235 | 10/1993 | Miyataka et al. | 365/210 |
| 5,737,260 | 4/1998 | Takata et al. | 365/210 |
| 5,764,581 | 6/1998 | Nix | 365/210 |

OTHER PUBLICATIONS

1996 IEEE International Solid–State Circuit Conference, Session 9/Paper FA9.4.

*Primary Examiner*—Trong Phan

[57] ABSTRACT

Disclosed is a semiconductor memory which performs stable sensing operation and minimizes the size of a device. The semiconductor memory having a plurality of bit lines and a plurality of word lines, includes a plurality of memory cells formed on crossing points of the respective bit lines and the respective word lines, a plurality of dummy cells formed on crossing points of one of the bit lines and a plurality of word lines, upper and lower sensing amplifiers respectively connected to the bit lines, for sensing data of the memory cells by inputting low and high reference levels depending on the dummy cells, and an input/output pad connected to respective output terminals of the upper and lower sensing amplifiers.

15 Claims, 5 Drawing Sheets

SEMICONDUCTOR MEMORY

BACKGROUND OF THE INVENTION

1. Field of the Invention

The present invention relates to a semiconductor memory, and more particularly, to a semiconductor memory having a single bit line structure.

2. Discussion of the Related Art

A conventional SRAM having a single bit line structure will be described with reference to FIG. 1.

FIG. 1 is a schematic circuit of a conventional SRAM having a single bit line structure.

As shown in FIG. 1, the conventional SRAM includes a plurality of bit lines $BL_O$–$BL_N$ formed in one direction, a plurality of word lines $WL_O$–$W_N$ formed to cross the bit lines respectively, a plurality of memory cells formed on crossing points of the respective bit lines and the respective word lines, and a plurality of sensing amplifiers $SA_O$–$SA_N$ for sensing data stored in the corresponding memory cell, through the respective bit lines.

If a high signal is applied to any word line, the memory cell connected to the word line is turned on so that data stored therein is output through the corresponding bit line. The data output from the memory cell is sensed to data 0 or 1 by the sensing amplifier connected to the corresponding bit line.

Generally, a multi-port SRAM includes a plurality of bit lines per one cell. If only a single bit line is used in such a multi-port SRAM, unstable data sensing is performed.

A conventional memory will be described with reference to the accompanying drawings.

FIG. 2 is a detailed schematic view of a conventional semiconductor memory.

As shown in FIG. 2, the conventional memory includes a bit line BL, a bit bar line $\overline{BL}$, a bit line pull-up transistor 21 connected to one side of the bit line, a bit bar line pull-up transistor 21a connected to one side of the bit bar line $\overline{BL}$, a memory cell connected to the bit line, and a sensing amplifier 25 for sensing data applied to the bit line BL and the bit bar line $\overline{BL}$ after equalizing the data.

The pull-up transistors 21 and 21a include a first transistor Q1 of which a gate and a source are connected to a power source voltage terminal Vcc, a second transistor Q2 of which a gate is connected to a signal applied to a cell plate and a drain is connected to a drain of the first transistor Q1, and a third transistor Q3 of which a gate is connected to the power source voltage terminal Vcc and a drain is connected to the drain of the second transistor Q2.

A fourth transistor Q4 is connected to the front end of the sensing amplifier 25, which equalizes the data applied to the bit line and the bit bar line.

The sensing amplifier 25 serves as a differential sensing amplifier, of which one terminal is connected to a drain of the fourth transistor Q4 and the other terminal is connected to a source thereof.

In the aforementioned conventional semiconductor memory, if the first transistor Q1 is turned on, "A" point is precharged at level of $V_{CC}$–$V_{th}$. At this time, if the cell plate is selected, the second transistor Q2 is turned on so that the bit line is precharged at level of $V_{CC}$–$V_{th}$–$\Delta V$. Since potentials of the bit line BL and the bit bar line $\overline{BL}$ are equalized by the fourth transistor Q4, the bit line is actually precharged at level $(V_{CC}$–$V_{th}$–$\Delta V)/2$. Precharge level of the bit line serves as a reference level.

If a word line for reading is selected and a high signal is applied, the precharge level of the bit line is varied as follows.

That is to say, if the memory cell is high when a high signal is applied to the word line shown in FIG. 2, the precharge level of the bit line is maintained at $(V_{CC}$–$V_{th}$–$\Delta V)/2+\Delta V_1$. While, if the memory cell is low, the precharge level of the bit line is maintained at $(V_{CC}$–$V_{th}$–$\Delta V)/2$–$\Delta V_1$.

In data sensing using the conventional semiconductor memory, since the sensing amplifier serves as a differential sensing amplifier, high level of the bit line has a value of $(V_{CC}$–$V_{th}$–$\Delta V)/2+\Delta V_1$ and the reference level has a value of $(V_{CC}$–$V_{th}$–$\Delta V)/2$, so that voltage swing of the bit line becomes $\Delta V_1$ substantially. Likewise, since low level of the bit line has a value of $(V_{CC}$–$V_{th}$–$\Delta V)/2$–$\Delta V_1$, voltage swing of the bit line becomes $\Delta V_1$, substantially.

FIG. 3 is a graph illustrating voltage swing of the bit line according to the conventional semiconductor memory.

As shown in FIG. 3, if the cell plate is selected and a high signal is applied to the word line WL, the precharge level of the bit line becomes $(V_{CC}$–$V_{th}$–$\Delta V)/2$. At this time, if the memory cell 23 is high, the precharge level of the bit line is maintained at $(V_{CC}$–$V_{th}$–$\Delta V)/2+\Delta V_1$. While if the memory cell 23 is low, the precharge level of the bit line is maintained at $(V_{CC}$–$V_{th}$–$\Delta V)/2\Delta V_1$. Therefore, since the precharge level of the bit line serves as a reference level when the cell plate is selected and a high signal is applied to the word line, voltage difference between the reference level and the precharge level depending on the memory cell becomes $\Delta V_1$.

However, the conventional semiconductor memory has several problems.

Since the bit line of $\Delta V_1$ has half swing, it is more unstable than full swing of the double bit line. This results in wrong data sensing in the case that the bit line is affected by noise.

SUMMARY OF THE INVENTION

Accordingly, the present invention is directed to a semiconductor memory that substantially obviates one or more of the problems due to limitations and disadvantages of the related art.

An object of the present invention is to provide a semiconductor memory in which full cell swing is performed using a dummy cell so that fast data sensing resistant to noise can be performed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor memory having a plurality of bit lines and a plurality of word lines, according to the present invention includes a plurality of memory cells formed on crossing points of the respective bit lines and the respective word lines, a plurality of dummy cells formed on crossing points of one of the bit lines and a plurality of word lines, upper and lower sensing amplifiers respectively connected to the bit lines, for sensing data of the memory cells by inputting low and high reference levels depending on the dummy cells, and an input/output pad connected to respective output terminals of the upper and lower sensing amplifiers.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
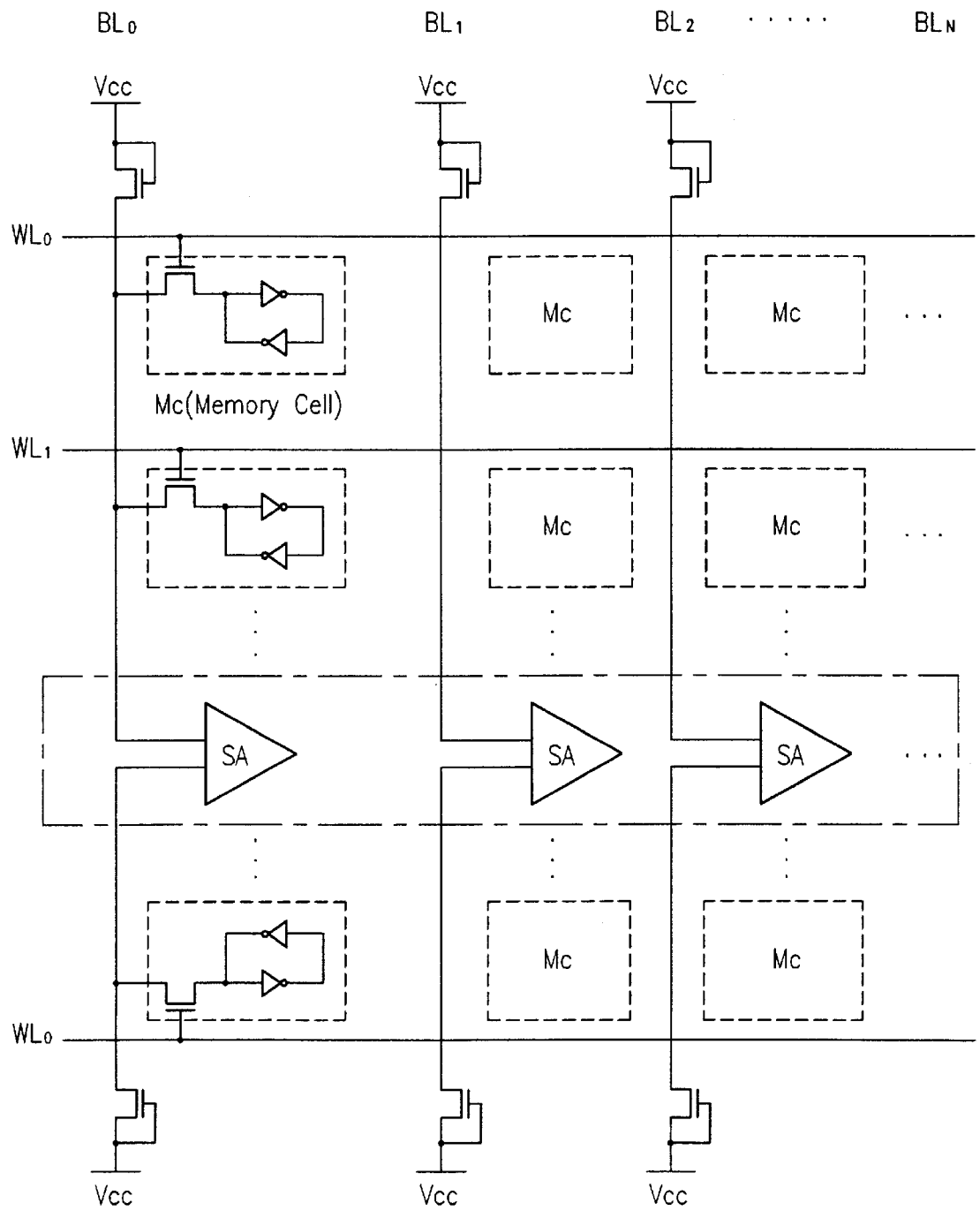
FIG. 1 is a schematic circuit illustrating a conventional SRAM.
Figure 2:
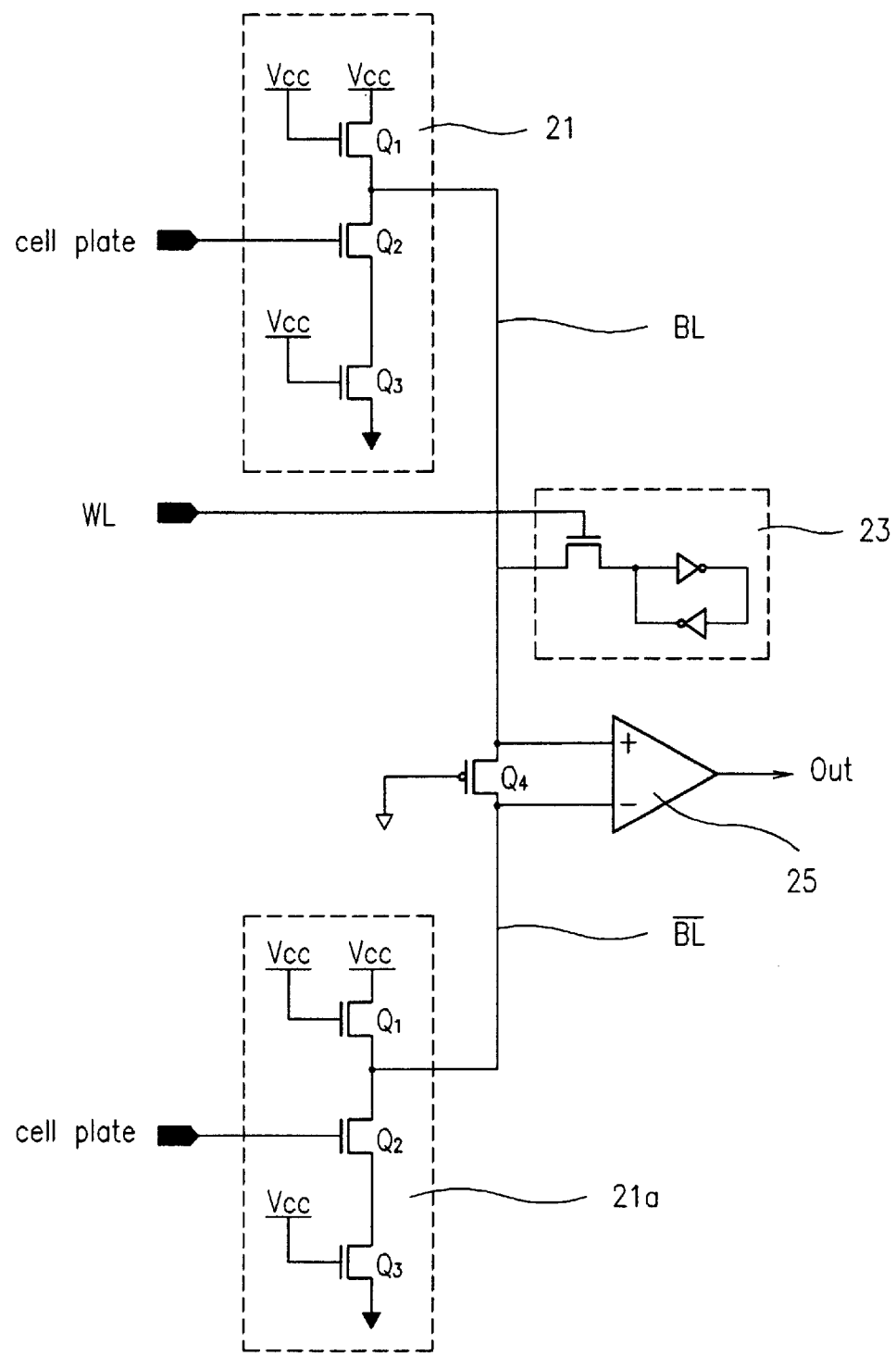
FIG. 2 is a detailed view of FIG. 1.
Figure 3:
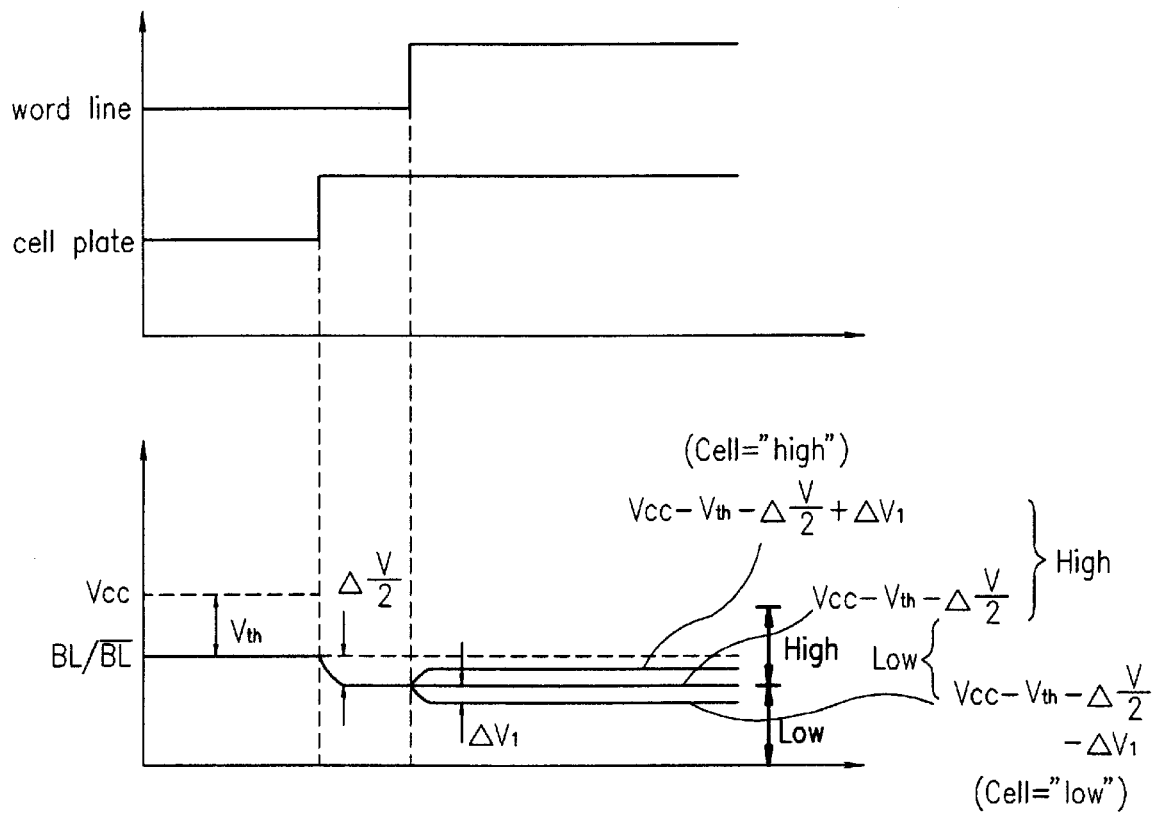
FIG. 3 is a graph illustrating voltage swing of a bit line according to a conventional semiconductor memory.
Figure 4:
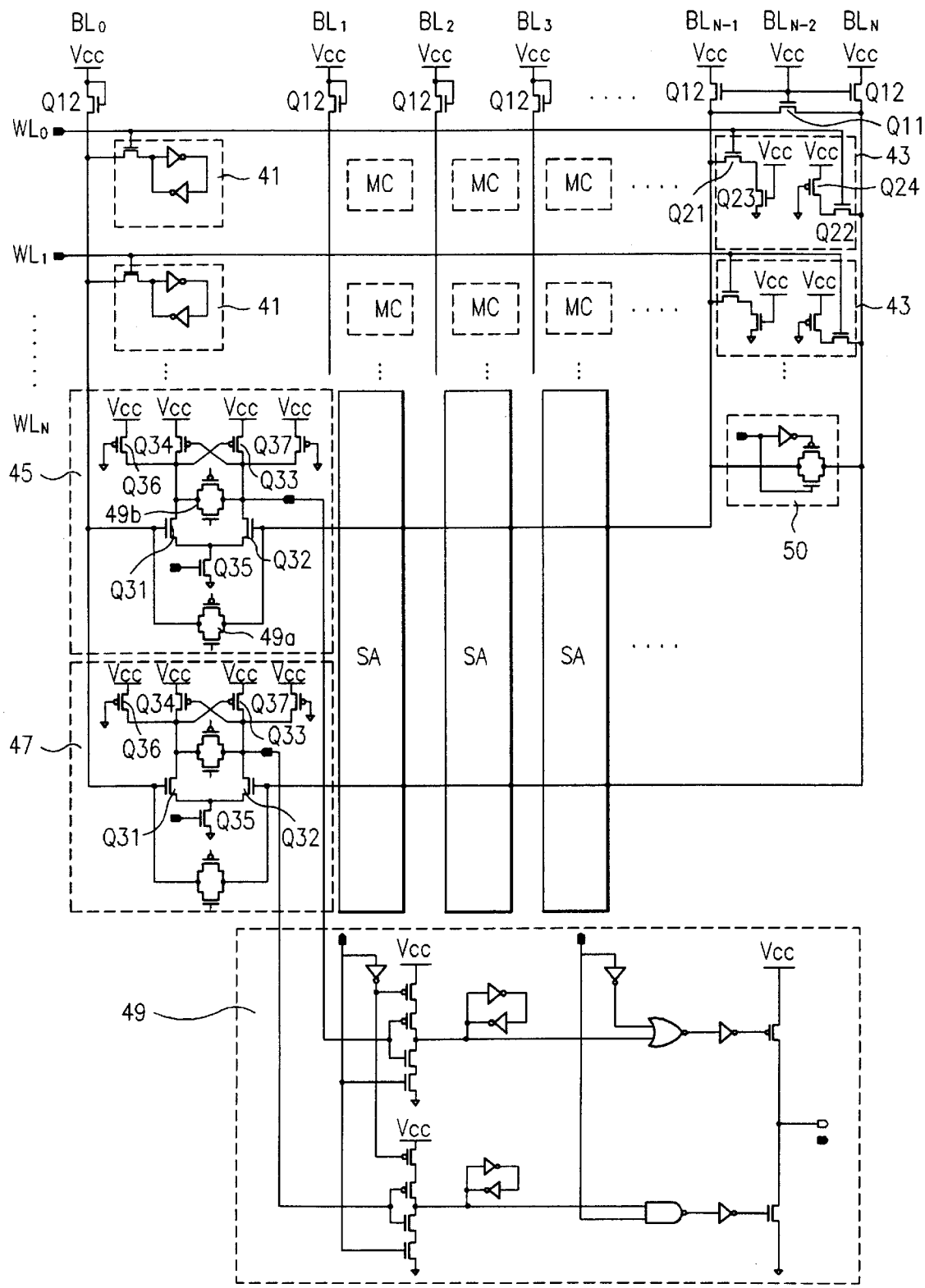
FIG. 4 is a schematic circuit illustrating a semiconductor memory according to the present invention.

As shown in FIG. 4, a semiconductor memory according to the present invention includes a plurality of word lines $WL_O$–$WL_N$ formed in one direction, a plurality of bit lines $BL_O$$BL_N$ formed to cross the word lines, a plurality of memory cells MC 41 formed on crossing points of the respective bit lines and the respective word lines, a plurality of dummy cells DC 43 connected to the respective word line between an N-1st bit line and an Nth bit line among the bit lines $BL_O$–$BL_N$, for outputting high and low reference levels, upper sensing amplifiers 45 for sensing data of a corresponding memory cell by inputting a voltage level of a corresponding bit line and the low reference level output from the dummy cell to a gate of a transistor Q32, lower sensing amplifiers 47 for sensing data of a corresponding memory cell by inputting the voltage level of the corresponding bit line and the high reference level output from the dummy cell to the gate of the transistor Q32, and an input/output pad 49 connected to output terminals of the upper and lower sensing amplifiers 45 and 47.

Here, a transistor Q11 is formed between the Nth bit line $BL_N$ and the N-1st bit line $BL_{N-1}$, which equalizes precharge level of the respective bit line. The Nth bit line $BL_N$ and the N-1st bit line $BL_{N-1}$ serve as reference bit lines.

The dummy cell of the aforementioned semiconductor memory includes two transistors Q21 and Q22 of which respective gates are connected to one word line and respective sources are respectively connected to the bit lines different from each other, and another two transistors Q23 and Q24 of which gates are connected to a power source voltage terminal Vcc and drains are respectively connected to drains of the transistors Q21 and Q22. The source of the transistor Q21 is connected to the N-1st bit line while the source of the transistor Q22 is connected to the Nth bit line.

In the aforementioned dummy cell 43, the low reference value is applied to the upper sensing amplifiers 45 through the N-1st bit line (reference bit line) and the high reference value is applied to the lower sensing amplifiers 47 through the Nth bit line (reference bit line).

The upper and lower sensing amplifiers will be described in detail with reference to FIG. 4.

The respective upper sensing amplifier 45 and the respective lower sensing amplifier 47 have the same configurations as each other. The upper sensing amplifier 45 outputs high data while the lower sensing amplifier 47 outputs low data.

As shown in FIG. 4, the upper sensing amplifier includes a transistor Q31 which is turned on/off by precharge level of a corresponding bit line, a transistor Q32 for inputting low reference from the dummy cell 43 to a gate, a transistor Q33 of which a gate is connected to a drain of the transistor Q31 and a drain is connected to a drain of the transistor Q32, a transistor Q34 of which a gate is connected to the drain of the transistor Q32 and a drain is connected to the drain of the transistor Q31, a first transfer gate 49a, comprising two transistors connected in parallel, between the gate of the transistor Q31 and the gate of the transistor Q32, a second transfer gate 49b, comprising two transistors connected in parallel, between the drain of the transistor Q31 and the drain of the transistor Q32, a transistor Q35 connected to the source of the transistor Q32 by multipoint, which is connected to the source of the transistor Q31, a transistor Q36 of which a source is connected to the power source voltage terminal and a drain is connected to the gate of the transistor Q33, and a transistor Q37 of which a source is connected to the power source voltage terminal and a drain is connected to the gate of the transistor Q34.

The transistors Q33, Q34, Q36 and Q37 are P type transistors.

The output terminal of the upper sensing amplifier 45 is formed between the source of the transistor Q32 and the drain of the transistor Q33. In the same manner as the upper sensing amplifier, the lower sensing amplifier is formed.

The upper sensing amplifier performs sensing operation when sufficient voltage difference occurs by means of the transistors Q31 and Q32, that is, difference voltage is sufficient.

In other words, the upper sensing amplifier 45 outputs high data when the voltage difference of $\Delta V$ occurs by inputting precharge level of the corresponding bit line and the low reference level from the dummy cell 43.

At this time, if the precharge level of the corresponding bit line is the same as the low reference level from the dummy cell 43, voltage difference does not occur. In this case, the upper sensing amplifier 45 fails to perform sensing operation.

Meanwhile, the lower sensing amplifier 47 outputs low data by inputting the precharge level of the corresponding bit line and the high reference level from the dummy cell 43. At this time, if the precharge level of the corresponding bit line is the same as the high reference level from the dummy cell 43, voltage difference does not occur. In this case, the lower sensing amplifier 47 fails to perform sensing operation.

The operation of the aforementioned semiconductor memory according to the present invention will now be described in detail.

As shown in FIG. 4, the respective bit line is precharged at $V_{CC}-V_{th}$ by the pull-up transistor Q12 before the word line is selected. At this time, the reference bit lines (N-1st bit line and Nth bit line) are precharged at $V_{CC}-V_{th}$, which are connected to the dummy cell 43, for supplying high and low references. If the word line is selected, two reference bit lines are equalized by the transistor Q11. Thus, the bit line and the reference bit line are maintained at $V_{CC}-V_{th}-\Delta V$. Under the circumstances, potential levels of the bit line and the reference bit line in the case that the data of the memory cell 41 is high and low, will be described below.

First, if the data of the memory cell 41 is high, the potential level of the bit line becomes $V_{CC}-V_{th}-\Delta V+\Delta V$ and finally maintained at $V_{CC}-V_{th}$.

At this time, the potential level $V_{CC}-V_{th}$ of the bit line is applied to the gate of the transistor Q31 of the upper sensing amplifier 45. The low reference level, that is, $V_{CC}-V_{th}-\Delta V-\Delta V=V_{CC}-V_{th}-2\Delta V$, is applied to the gate of the transistor Q32 through the reference bit line (N-1st bit line).

Therefore, since the difference voltage (voltage difference) of $2\Delta V$ occurs in the upper sensing amplifier 45, the upper sensing amplifier 45 outputs high data through the output terminal. At this time, to the lower sensing amplifier 47, $V_{CC}-V_{th}-\Delta V$ is applied through the bit line, while the high reference level, that is, $V_{CC}-V_{th}-\Delta V+\Delta V=V_{CC}-V_{th}$, is applied through the reference bit line (Nth bit line).

However, since the difference voltage actually does not occur, the lower sensing amplifier 47 fails to perform sensing operation but outputs middle level data.

The outputs of the upper and lower sensing amplifiers 45 and 47 are applied to the input/output pad respectively so that they finally output only high data.

Meanwhile, if the data of the memory cell 41 is low, the precharge level of the bit line is maintained at $V_{CC}-V_{th}-\Delta V-\Delta V=V_{CC}-V_{th}2\Delta V$.

At this time, to the upper sensing amplifier 45, $V_{CC}-V_{th}2\Delta V$ is applied through the bit line and at the same time $V_{CC}-V_{th}-2\Delta V$ is applied through the reference bit line.

Therefore, since the difference voltage does not occur in the upper sensing amplifier 45, the upper sensing amplifier 45 fails to perform sensing operation and outputs middle level data by means of the transistors Q36 and Q37.

However, to the lower sensing amplifier 47, $V_{CC}-V_{th}2\Delta V$ is applied through the bit line and at the same time $V_{CC}-V_{th}-\Delta V+\Delta V=V_{CC}-V_{th}$ is applied through the reference bit line.

Therefore, the difference voltage of $2\Delta V$ occurs in the lower sensing amplifier 47 so that the lower sensing amplifier 47 outputs low data through the output terminal.

At this time, since the output terminals of the upper and lower sensing amplifiers 45 and 47 are connected to the input/output pad, the upper and lower sensing amplifiers 45 and 47 output only low data.

As shown in FIG. 4, element 49 is a series of logical elements which serves to combine the output signals from sensing amplifiers 45 and 47. The output from upper sensor amplifier 45 is input to an inverter comprising four transistors. The output of this inverter is input into a NOR gate, which also functions as an inverter. The output of the NOR gate is input into another inverter, whose output is connected to a PMOS transistor. Hence, if the output of upper sensing amplifier 45 is high, the signal is inverted three times and input to the PMOS transistor as a low logic signal. Such a low signal turns on the PMOS transistor, thereby causing the output of element 49 to go high. Similarly, the logical gates connected to the lower sensing amplifier 47 are nearly identical to those connecting to the upper sensing amplifier, namely a four transistor inverter, a two input NAND gate, and an inverter. Also, the transistor connected to the last inverter is an NMOS type. Hence, if the output signal of lower sensing amplifier 47 is low, the NMOS transistor will be turned on thereby driving the output of element 49 low. However, if the output of element 47 is intermediate, the NMOS transistor will not be turned on. In this manner, element 49 combines the outputs of upper sensing amplifier 45 and the lower sensing amplifier 47.

Figure 5:
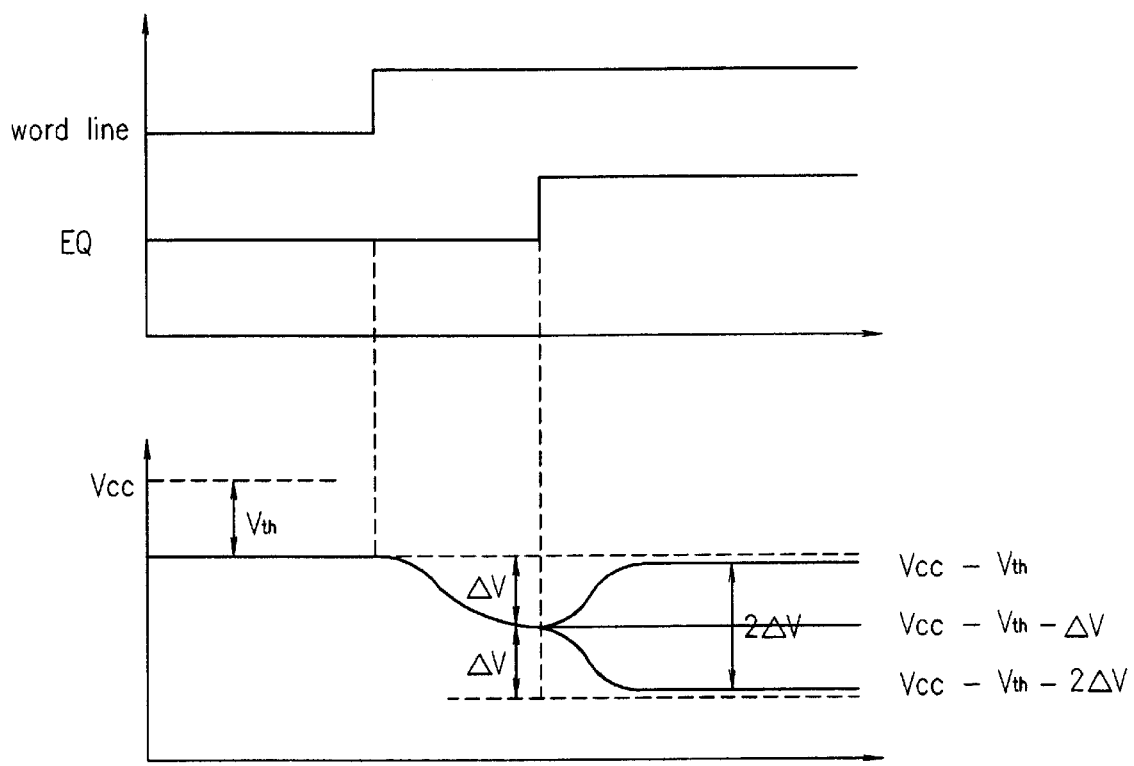
FIG. 5 is a graph illustrating voltage swing of a bit line of a semiconductor memory according to the present invention.

Here, if a threshold voltage of the pull-up transistor Q12 connected to the N-1st bit line differs from a threshold voltage of the pull-up transistor Q12 connected to the Nth bit line, a transfer gate 50 controls the threshold voltages of the respective bit lines at the same level FIG. 5 is a graph illustrating voltage swing of a bit line of a semiconductor memory according to the present invention.

As shown in FIG. 5, it is noted that the voltage swing of the corresponding bit line is $2\Delta V$ if the word line is selected and the memory cell is low or high. Therefore, stable sensing operation in a single bit line can be performed in the same manner that a double bit line is used.

In other words, the semiconductor memory of the present invention performs data sensing operation using the low reference level and high reference level of the dummy cell 43 in the same manner that the double bit line is used.

As aforementioned, the semiconductor memory of the present invention has the following advantages.

That is, since a single bit line is used in multi-port SRAM, chip size can be reduced significantly.

In addition, since a single bit line is used in the same manner as a double bit line, fast sensing operation can be performed and malfunction due to noise can be avoided.

It will be apparent to those skilled in the art that various modifications and variations can be made in the semiconductor memory of the present invention without departing from the spirit or scope of the invention. Thus, it is intended that the present invention covers the modifications and variations of the invention provided they come within the scope of the appended claims and their equivalents.

What is claimed is:

1. A semiconductor memory having a plurality of bit lines and a plurality of word lines, the semiconductor memory comprising:

a plurality of memory cells formed on crossing points of the respective bit lines and the respective word lines;

a plurality of dummy cells formed on crossing points of one of the bit lines and a plurality of word lines;

upper and lower sensing amplifiers respectively connected to the bit lines, for sensing data of the memory cells while receiving low and high reference levels from the dummy cells; and an input/output pad connected to respective output terminals of the upper and lower sensing amplifiers.

2. The semiconductor memory as claimed in claim 1, wherein the low reference level is input to the upper sensing amplifiers while the high reference level is input to the lower sensing amplifiers.

3. The semiconductor memory as claimed in claim 1, wherein the respective upper sensing amplifier connected to the corresponding bit line outputs high data if data of one of the memory cells is high, while the respective lower sensing amplifier connected to the corresponding bit line outputs low data if the data of one of the memory cells is low.

4. A semiconductor memory comprising:

N bit lines formed in one direction, where N is an integer;

a plurality a word lines formed to cross the bit lines;

a plurality of memory cells formed on crossing points of the respective bit lines and the respective word lines;

a plurality of dummy cells connected to the respective word lines at a point between an N-1st bit line and an Nth bit line among the bit lines;

upper sensing amplifiers for sensing data of the memory cells while receiving a low reference voltage applied through the N-1st bit line and voltage applied through a corresponding bit line;

lower sensing amplifiers for sensing data of the memory cells while receiving a high reference voltage applied through the Nth bit line and a voltage applied through a corresponding bit line; and an input/output pad connected to output terminals of the upper and lower sensing amplifiers.

5. The semiconductor memory as claimed in claim 4, wherein the high and low reference voltages are determined by the dummy cells.

6. The semiconductor memory as claimed in claim 4, wherein the respective upper sensing amplifier connected to the corresponding bit line outputs high data if data of one of the memory cells is high, while the respective lower sensing amplifier connected to the corresponding bit line outputs low data if data of one of the memory cells is low.

7. The semiconductor memory as claimed in claim 4, wherein the N-1st bit line and the Nth bit line serve as reference bit lines.

8. The semiconductor memory as claimed in claim 4, wherein, between the Nth bit line and the N-1st bit line, a transistor is formed, which equalizes precharge level between the N-1st bit line and the Nth bit line.

9. The semiconductor memory as claimed in claim 4, wherein the respective dummy cell includes a pair of first transistors of which gates are connected to the same word line and sources are connected to different bit lines, and a pair of second transistors of which drains are connected to drains of the first transistors and gates are connected to a power source voltage terminal Vcc.

10. The semiconductor memory as claimed in claim 4, wherein the respective upper sensing amplifier and the respective lower sensing amplifier have the same configurations as each other.

11. The semiconductor memory as claimed in claim 10, wherein the upper sensing amplifier includes:

a transistor Q31 turned on/off by precharge level of a corresponding bit line;

a transistor Q32 for inputting a low reference level from the dummy cells to a gate;

a transistor Q33 of which a gate is connected to a drain of the transistor Q31 and a drain is connected to a drain of the transistor Q32;

a transistor Q34 of which a gate is connected to the drain of the transistor Q32 and a drain is connected to the drain of the transistor Q31;

a first transfer gate connected in parallel between the drain of the transistor Q31 and the drain of the transistor Q32;

a second transfer gate connected in parallel between the gate of the transistor Q31 and the gate of the transistor Q32;

a transistor Q35 connected to the source of the transistor Q32 by multipoint, which is connected to the source of the transistor Q31;

a transistor Q36 of which a source is connected to the power source voltage terminal and a drain is connected to the gate of the transistor Q33; and a transistor Q37 of which a source is connected to the power source voltage terminal and a drain is connected to the gate of the transistor Q34.

12. The semiconductor memory as claimed in claim 11, wherein the transistors Q33, Q34, Q36, and Q37 are P type transistors.

13. A semiconductor memory having a plurality of bit lines and a plurality of word lines, the semiconductor memory comprising:

a memory cell formed at a crossing point of a bit line and a word line;

a dummy cell formed at a crossing point of two reference bit lines and the word line, and producing a high reference voltage and a low reference voltage;

an upper sensing amplifier connected to the bit line, for sensing a high state of the memory cell in conjunction with the low reference voltage from the dummy cell;

a lower sensing amplifier connected to the bit line, for sensing a low state of the memory cell in conjunction with the high reference voltage from the dummy cell; and a logic gate for combining outputs from the upper and lower sensing amplifiers.

14. A semiconductor memory as in claim 13, wherein when the word line is selected, the memory cell causes the bit line to change voltage by a predetermined value, such that the bit line voltage either equals the high reference voltage and differs by twice the predetermined value from the low reference voltage, or equals the low reference voltage and differs by twice the predetermined value from the high reference voltage.

15. A method of increasing a differential voltage to a sensing amplifier having first and second differential inputs, the first differential input being connected to a bit line and a memory cell in a semiconductor memory, the semiconductor memory further including a dummy cell connected to a reference bit line and connected the second differential input, comprising:

precharging the dummy cell;

equalizing a voltage on the bit line and a voltage on the reference bit line;

selecting a word line associated with the memory cell and dummy cell, whereby the memory cell causes the bit line to change voltage by a predetermined value, and the dummy cell causes the reference bit line to change voltage by the predetermined value, such that the respective bit line and reference bit line voltages are either equal, or differ by twice the predetermined value, depending on a state of the memory cell.

* * * * *